United States Patent
Hsu

(10) Patent No.: US 12,501,625 B2
(45) Date of Patent: *Dec. 16, 2025

(54) HARD MASK FOR MTJ PATTERNING

(71) Applicant: Taiwan Semiconductor Manufacturing Company, Ltd., Hsin-Chu (TW)

(72) Inventor: Chern-Yow Hsu, Chu-Bei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/442,409

(22) Filed: Feb. 15, 2024

(65) Prior Publication Data

US 2024/0260277 A1    Aug. 1, 2024

Related U.S. Application Data

(60) Continuation of application No. 17/854,058, filed on Jun. 30, 2022, now Pat. No. 11,943,934, which is a
(Continued)

(51) Int. Cl.
*H10B 61/00* (2023.01)
*H10N 50/01* (2023.01)
*H10N 50/80* (2023.01)

(52) U.S. Cl.
CPC ............ *H10B 61/22* (2023.02); *H10N 50/01* (2023.02); *H10N 50/80* (2023.02)

(58) Field of Classification Search
CPC .............................................. H10N 30/87–877
(Continued)

(56) References Cited

U.S. PATENT DOCUMENTS 7,723,128 B2    5/2010   Wang et al.
9,406,876 B2 *  8/2016   Pinarbasi ............... H10N 50/01
(Continued)

FOREIGN PATENT DOCUMENTS

CN       103187522 A    7/2013
CN       106601904 A    4/2017

OTHER PUBLICATIONS

Matchett, Mike. "MRAM Technology Likely Choice as Post-Flash Solid-State Storage." Published in May 2013. Retrieved online on Oct. 22, 2018 from https://searchstorage.techtarget.com/opinion/MRAM-technology-likely-choice-as-post-flash-solid-state-storage.
(Continued)

*Primary Examiner* — Mark W Tornow
*Assistant Examiner* — Priya M Rampersaud
(74) *Attorney, Agent, or Firm* — Eschweiler & Potashnik, LLC

(57) ABSTRACT

The present disclosure relates to a method of forming an integrated chip. The method includes forming a magnetic tunnel junction (MTJ) stack over a bottom electrode layer. A sacrificial dielectric is formed over the MTJ stack. The sacrificial dielectric is patterned to form a cavity. A top electrode material is formed within the cavity and a mask is formed over the top electrode material. The top electrode material extends from directly below the mask to laterally past an outermost sidewall of the mask. The sacrificial dielectric is removed. The MTJ stack is patterned according to the top electrode material and the mask to form an MTJ after removing the sacrificial dielectric. An etchant that is used to pattern the MTJ stack etches the top electrode material with the mask in place.

20 Claims, 12 Drawing Sheets

Related U.S. Application Data division of application No. 16/412,776, filed on May 15, 2019, now Pat. No. 11,508,782.

(60) Provisional application No. 62/750,331, filed on Oct. 25, 2018.

(58) Field of Classification Search
IPC .............. H01L 21/027, 21/76816, 21/3213, 21/76802, 21/76811, 21/76813, 21/76832, 21/76877; H10B 61/22, 23/5226, 21/76802, 21/3213, 21/76877, 21/32139, 21/28123, 21/7684, 21/7685, 29/40
See application file for complete search history.

(56) References Cited

U.S. PATENT DOCUMENTS

| | | | |
|---|---|---|---|
| 9,917,137 B1 | 3/2018 | Briggs et al. | |
| 10,008,536 B2* | 6/2018 | Annunziata | H10N 50/80 |
| 2008/0096290 A1 | 4/2008 | Smith et al. | |
| 2010/0200900 A1* | 8/2010 | Iwayama | H10N 50/01 257/295 |
| 2011/0189796 A1 | 8/2011 | Lu et al. | |
| 2012/0230091 A1 | 9/2012 | Yanagi et al. | |
| 2013/0015541 A1 | 1/2013 | Kanaya | |
| 2013/0032775 A1* | 2/2013 | Satoh | H10N 70/826 257/1 |
| 2013/0171742 A1* | 7/2013 | Wang | H10N 50/01 438/3 |
| 2014/0227802 A1 | 8/2014 | Hsu et al. | |
| 2014/0227804 A1* | 8/2014 | Hsu | H01L 21/28123 156/345.31 |
| 2015/0236251 A1 | 8/2015 | Noh et al. | |
| 2015/0263273 A1 | 9/2015 | Yoshikawa et al. | |
| 2016/0072048 A1* | 3/2016 | Ito | H10N 50/10 257/421 |
| 2016/0380183 A1 | 12/2016 | Chuang et al. | |
| 2017/0054070 A1 | 2/2017 | Bak et al. | |
| 2017/0092850 A1* | 3/2017 | Lee | H10N 50/10 |
| 2017/0110649 A1 | 4/2017 | Diaz et al. | |
| 2018/0158867 A1* | 6/2018 | Kim | H10B 61/22 |
| 2019/0067559 A1* | 2/2019 | Chang | H10N 50/10 |

OTHER PUBLICATIONS

Wikipedia.org "Tunnel Magnetoresistance." Published on Aug. 17, 2018. Retrieved online on Oct. 22, 2018 from https://en.wikipedia.org/wiki/Tunnel_magnetoresistance.
Rouse, Margaret. "MRAM (Magnetoresistive Random Access Memory)." Published on Sep. 21, 2005. Retrieved online on Oct. 22, 2018 from https://searchstorage.techtarget.com/definition/MRAM.
Non-Final Office Action dated Jun. 16, 2021 for U.S. Appl. No. 16/412,776.
Final Office Action dated Oct. 6, 2021 for U.S. Appl. No. 16/412,776.
Non-Final Office Action dated Mar. 2, 2022 for U.S. Appl. No. 16/412,776.
Notice of Allowance dated Jul. 13, 2022 for U.S. Appl. No. 16/412,776.
Non-Final Office Action dated Jun. 23, 2023 for U.S. Appl. No. 16/412,776.
Notice of Allowance dated Nov. 22, 2023 for U.S. Appl. No. 16/412,776.

* cited by examiner

HARD MASK FOR MTJ PATTERNING

REFERENCE TO RELATED APPLICATIONS

This Application is a Continuation of U.S. application Ser. No. 17/854,058, filed on Jun. 30, 2022, which is a Divisional of U.S. application Ser. No. 16/412,776, filed on May 15, 2019 (now U.S. Pat. No. 11,508,782, issued on Nov. 22, 2022), which claims the benefit of U.S. Provisional Application No. 62/750,331, filed on Oct. 25, 2018. The contents of the above-referenced Patent Applications are hereby incorporated by reference in their entirety.

BACKGROUND

Many modern-day electronic devices contain electronic memory configured to store data. Electronic memory may be volatile memory or non-volatile memory. Volatile memory stores data while it is powered, while non-volatile memory is able to store data when power is removed. Magneto resistive random-access memory (MRAM) devices are a type of non-volatile memory that are promising candidates for the next generation of non-volatile electronic memory as MRAM devices provide faster speeds and have longer lifespans compared to other commonly used non-volatile memory. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
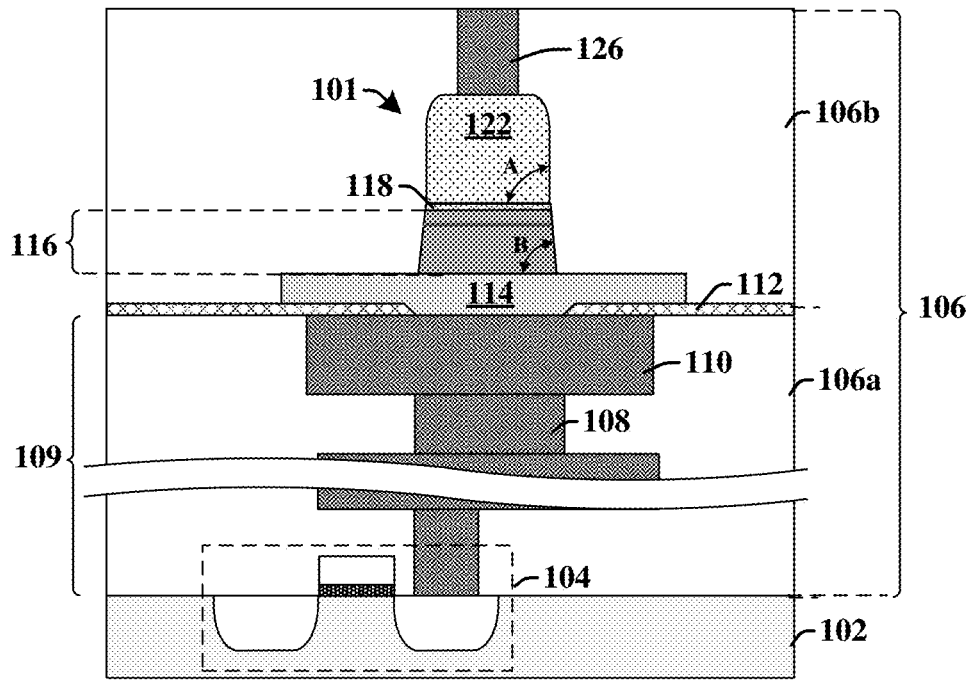
FIG. 1 illustrates a cross-sectional view of some embodiments of an integrated chip having a magnetoresistive random-access memory (MRAM) device comprising a magnetic tunnel junction (MTJ) stack between top and bottom electrodes.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetoresistive random-access memory (MRAM) device includes a magnetic tunnel junction (MTJ) stack arranged between top and bottom electrodes. The MTJ stack comprises a thin insulating layer arranged between two magnetic layers. Many MTJs make up an MRAM device that reads, writes, and stores data using magnetic orientations. As technology is developed to be smaller and more efficient, manufacturing methods often need to be adjusted to accommodate for the smaller dimensions.

Typically, an MRAM device may be formed by depositing MTJ layers over a bottom electrode layer, and depositing a top electrode layer over the MTJ layers. A hard mask structure is then deposited over the top electrode layer. The top electrode layer undergoes a first etch according to the hard mask structure. Then, a remaining portion of the hard mask structure and the top electrode layer are used as a mask for a second etch of the MTJ layers to form the MTJ stack.

Oftentimes the first etch may etch different parts of the top electrode layer at different lateral etch rates, causing a resulting top electrode to have deformities, especially when the top electrode is made of more than one layer of material. For example, a top electrode layer with a higher lateral etch rate will have a small width after the first etch than other top electrode layers with lower lateral etch rates. Thus, a top electrode with more than one layer of material will not have a smooth sidewall after the first etch. When the first etch results in a non-uniform width of the top electrode, control of a critical the second etch results in a non-uniform width of the MTJ stack. A non-uniform width of the MTJ stack causes problems with control over magnetic properties in the MTJ, which impacts the reliability of the MRAM to read, write, and store data.

In the present disclosure, a new method of manufacturing MTJ stacks is presented to produce reliable MRAM devices. The new manufacturing method eliminates a top electrode etch such that there is improved control over critical dimensions of the top electrode structure and subsequently the MTJ stack.

FIG. 1 illustrates a cross-sectional view of some embodiments of an integrated chip 100 comprising an MRAM cell.

The integrated chip 100 includes an MRAM cell 101 arranged over a substrate 102. The MRAM cell 101 comprises an MTJ stack 116, which is separated from the substrate 102 by one or more lower interconnect layers 109 embedded within a dielectric structure 106. The dielectric structure 106 may comprise one or more stacked inter-level dielectric (ILD) layers. The one or more lower interconnect layers 109 comprise, in many embodiments, interconnect vias 108 and interconnect wires 110 configured to connect a bottom electrode 114 to a first access transistor 104. The MRAM cell 101 comprises a top electrode 122 and the bottom electrode 114, which are separated from one another by the MTJ stack 116.

In some embodiments, the dielectric structure 106 comprises an etch stop structure 112 arranged between a lower dielectric structure 106a surrounding the one or more lower interconnect layers 109 and an upper dielectric structure 106b surrounding the MRAM cell 101. In such embodiments, the bottom electrode 114 protrudes through the etch stop structure 112 to electrically connect to the one or more lower interconnect layers 109. An upper interconnect structure 126 is coupled to the top electrode 122. A capping layer 118, in some embodiments, may be arranged over the MTJ stack 116 and below the top electrode 122 to enforce structural properties and thus, protect magnetic properties of the MTJ stack 116. The capping layer 118 has outer sidewalls that are aligned to outer sidewalls of the MTJ stack 116.

In many embodiments, the top electrode 122 has rounded upper corners that are coupled to sidewalls of the top electrode 122. The sidewalls of the top electrode 122 meet a bottom surface of the top electrode 122 at an angle A. The MTJ stack 116 has smooth sidewalls that meet a bottom surface of the MTJ stack 116 at an angle B, which is less than or equal to angle A. For example, angle A may be in the range of between approximately 80° and approximately 90°. Angle B may be in the range of between approximately 70° and approximately 90°.

Angle A is larger than angle B because the top electrode 122 is subjected to a single etch, which occurs during patterning of the underlying MTJ stack 116. By subjecting the top electrode 122 to a single etch (rather than to a first etch during patterning of the top electrode 122 and a second etch during patterning of the MTJ stack 116), a critical dimension of the top electrode 122 is able to be more accurately controlled. The critical dimension of the top electrode 122 may be, for example, in the range of between approximately 15 nanometers and approximately 150 nanometers. By more accurately controlling the critical dimension of the top electrode 122, a critical dimension of the MTJ stack 116 is able to be more accurately controlled resulting in an MRAM device having good reliability to read and write data.

Figure 2:
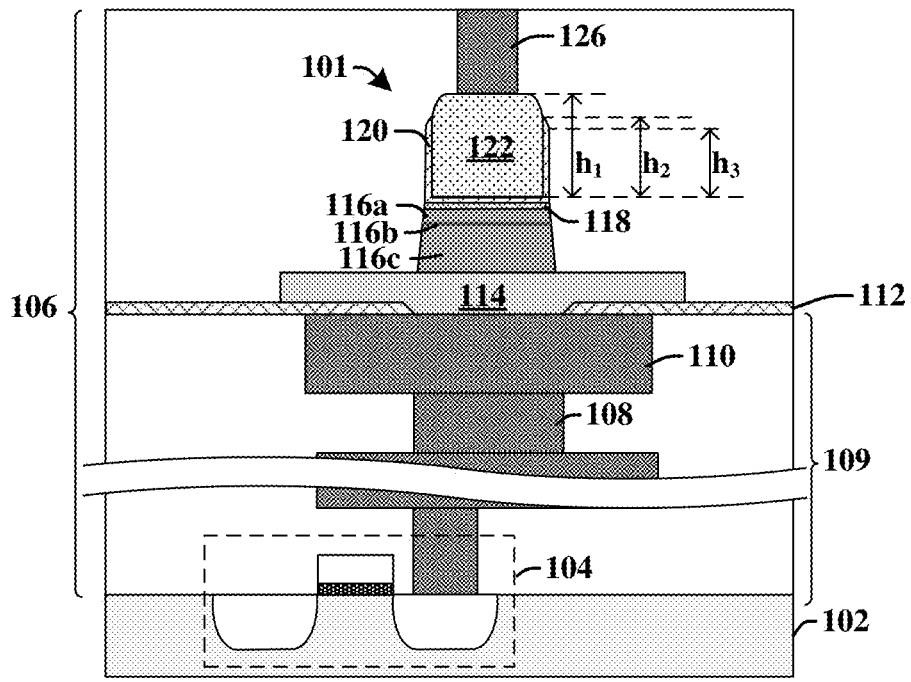
FIG. 2 illustrates a cross-sectional view of some additional embodiments of an integrated chip having an MRAM device comprising a MTJ stack between a bottom electrode and a top electrode partially surrounded by a glue layer.

FIG. 2 illustrates an additional embodiment of a cross-sectional view of an integrated chip 200 comprising an MRAM cell.

The integrated chip 200 includes an MRAM cell 101 arranged over a substrate 102. The MRAM cell 101 comprises a top electrode 122 and a bottom electrode 114, which are separated from one another by an MTJ stack 116. The MTJ stack 116 comprises a lower ferromagnetic electrode 116c separated from an upper ferromagnetic electrode 116a by a thin tunneling barrier layer 116b. The lower ferromagnetic electrode 116c is coupled to the bottom electrode 114. In some embodiments, a width of the bottom electrode 114 is larger than a width of the lower ferromagnetic electrode 116c. The upper ferromagnetic electrode 116a is electrically coupled to the top electrode 122. Electron tunneling occurs between the upper ferromagnetic electrode 116a and the lower ferromagnetic electrode 116c through the thin tunneling barrier layer 116b. The relationship of the magnetic orientations of the lower and upper ferromagnetic electrodes 116c, 116a determines if the MRAM cell will read, write or store data. Outer sidewalls of the lower ferromagnetic electrode 116c, the thin tunneling barrier layer 116b, the upper ferromagnetic electrode 116a, and the capping layer 118, are aligned and together, have a continuous, smooth surface.

A capping layer 118, in some embodiments, may be arranged over the MTJ stack 116 and below the top electrode 122. The capping layer 118 may have a thickness in the range of between approximately 0.5 nanometers and approximately 15 nanometers. The capping layer 118 may be made of, for example, tantalum, titanium, tantalum nitride, titanium nitride, or combinations thereof, and the top electrode 122 may be made of one or more conductive materials, for example, tantalum, titanium, tantalum nitride, titanium nitride, tungsten, ruthenium, or layered combinations thereof. The capping layer 118 may have a thickness in the range of between approximately 0.5 nanometers and approximately 15 nanometers.

Oftentimes, there is poor adhesion at the interface of the capping layer 118 and the top electrode 122. Thus, in some embodiments, a glue layer 120 between the top electrode 122 and the capping layer 118 to improve adhesion between the top electrode 122 and the capping layer 118. In some embodiments, the glue layer 120 may comprise or be a diffusion barrier layer. In some embodiments, the glue layer 120 may have a lower surface directly contacting the capping layer 118 and an upper surface directly contacting the top electrode 122. The capping layer 118 has a lower surface having a width that is approximately equal to a width of an upper surface of the upper ferromagnetic electrode 116a. The glue layer 120 may comprise, for example, tantalum, titanium, tantalum nitride, titanium nitride, or combinations thereof.

The glue layer 120, in some embodiments, is continuous and along a sidewall of the top electrode 122 and a bottom surface of the top electrode 122. In such embodiments, the top electrode 122 has a first maximum height $h_1$ measured from a bottom surface of the top electrode 122. The first maximum height $h_1$ may measure to be in the range of between approximately 10 nanometers and approximately 100 nanometers. The glue layer 120 has an inner sidewall that has a second maximum height $h_2$ measured from the bottom surface of the top electrode 122. The second maximum height $h_2$ measures to be less than the first maximum height $h_1$ by a range of between approximately 2 nanometers and approximately 6 nanometers, due to difference in etching rates during patterning steps. The glue layer 120 has an outer sidewall that has a third maximum height $h_3$ measured from the bottom surface of the top electrode 122. The third maximum height $h_3$ measures to be less than the second maximum height $h_2$ by a range of between approximately 1 nanometer and approximately 5 nanometers, due to etching effects. In some embodiments, the inner sidewall of the glue layer 120 is connected to the outer sidewall of the glue layer by a rounded corner.

Figure 3A:
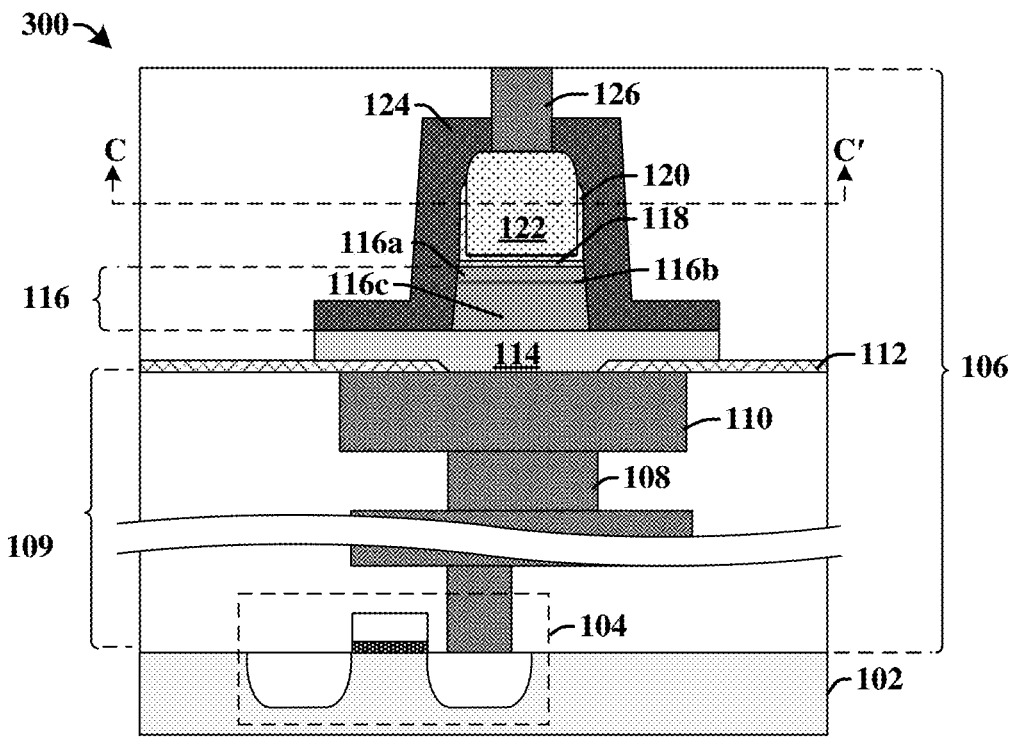
FIGS. 3A-3B illustrate some additional embodiments of an integrated chip having an MRAM device comprising a MTJ stack between top and bottom electrodes surrounded by sidewall spacers.

FIG. 3A illustrates an additional embodiment of a cross-sectional view of an integrated chip 300 comprising an MRAM cell.

FIG. 3A comprises the same features as the integrated chip 200 of FIG. 2 in addition to sidewall spacers 124. The sidewall spacers 124 are made of a dielectric material. In some embodiments, outer sidewalls of the sidewall spacers 124 are aligned with outer sidewalls of a bottom electrode 114. An upper interconnect structure 126 protrudes through the sidewall spacers 124 such that the upper interconnect structure 126 is coupled to a top electrode 122.

Figure 3B:
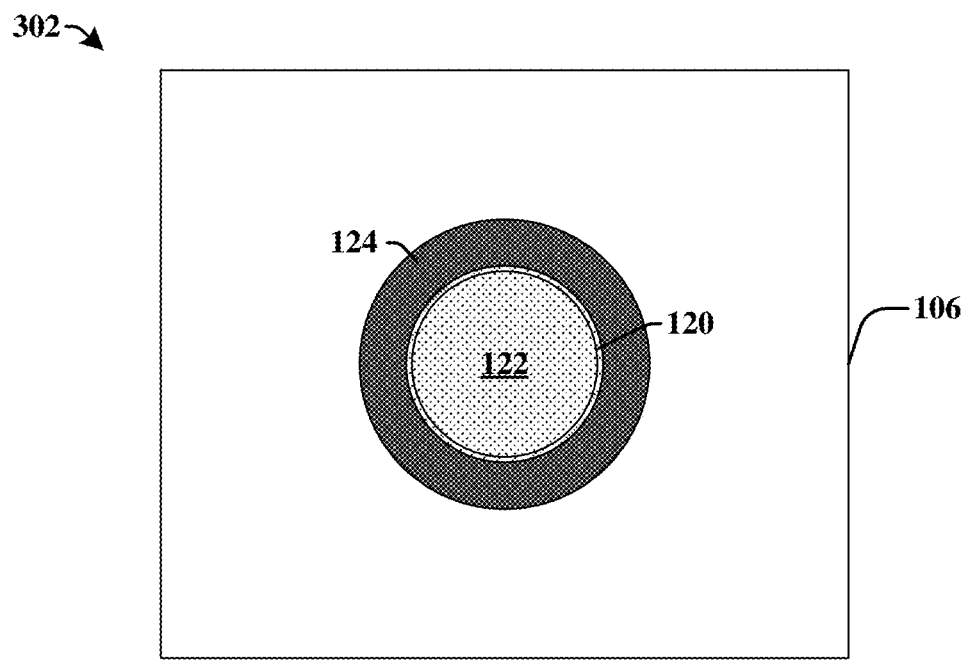

As shown in top-view 302 of FIG. 3B, the sidewall spacers 124 surround the top electrode 122 such that the top electrode 122 is separated from dielectric structure 106. In some embodiments, a glue layer 120 (e.g., a diffusion barrier layer) is separates the top electrode 122 from the sidewall spacers 124. In some embodiments, the top electrode 122 and the sidewall spacers 124 have a top-view that resemble concentric circle. In other embodiments, the top-view of the top electrode 122 and the sidewall spacers 124 may for example, have a top-view that resembles an oval, a quadrilateral, or a polygon.

Figure 4A:
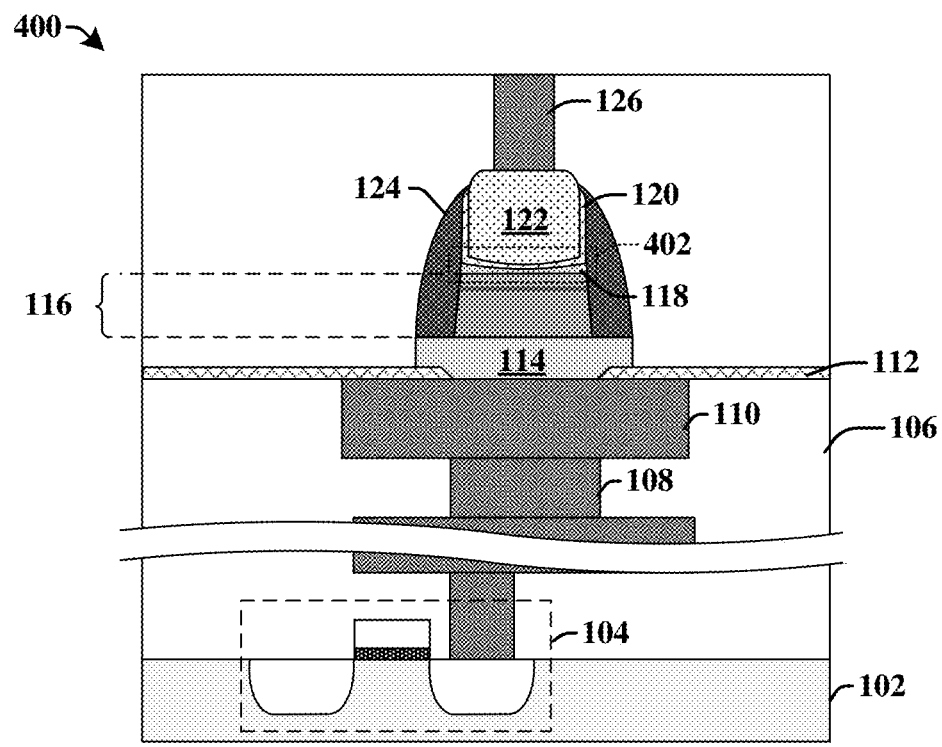
FIGS. 4A-4B illustrate some additional embodiments of an integrated chip having an MRAM device comprising a MTJ stack between top and bottom electrodes surrounded by sidewall spacers.

FIG. 4A illustrates an additional embodiment of a cross-sectional view of an integrated chip 400 comprising an MRAM cell.

FIG. 4A comprises sidewall spacers 124 with a different shape than the sidewall spacers 124 illustrated in FIG. 3A. In FIG. 4, the sidewall spacers 124 have curved outer sidewalls such that the sidewall spacers 124 have sidewalls that decrease in thickness from a bottom surface of the sidewall spacers 124 to a top surface of the sidewall spacers 124. The sidewall spacers 124, in some embodiments, does not cover top surfaces of the top electrode 122, as illustrated in FIG. 4.

Figure 4B:
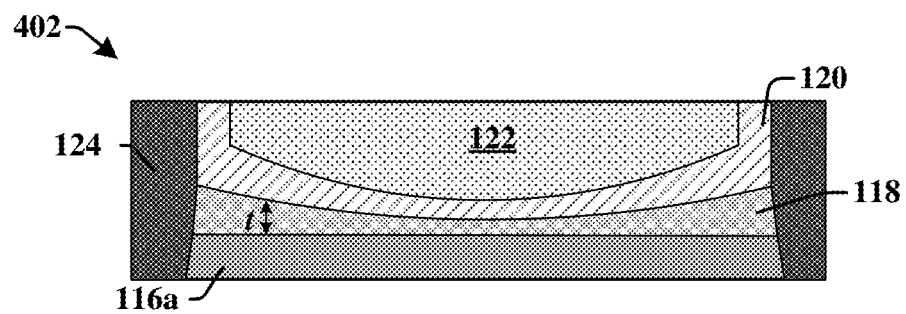

FIG. 4B represents a zoomed in illustration outlined by box 402 in FIG. 4A of integrated chip 400. In some embodiments, as illustrated by FIG. 4B, a capping layer 118 has an upper surface that is not planar. For example, in some embodiments, the capping layer 118 has a thickness t that increases from a center of the capping layer 118 to outer sidewalls of the capping layer 118, thereby giving the capping layer 118 a concave upper surface. In such embodiments, lower surfaces of the glue layer 120 and/or the top electrode 122 are also not planar.

Figure 5:
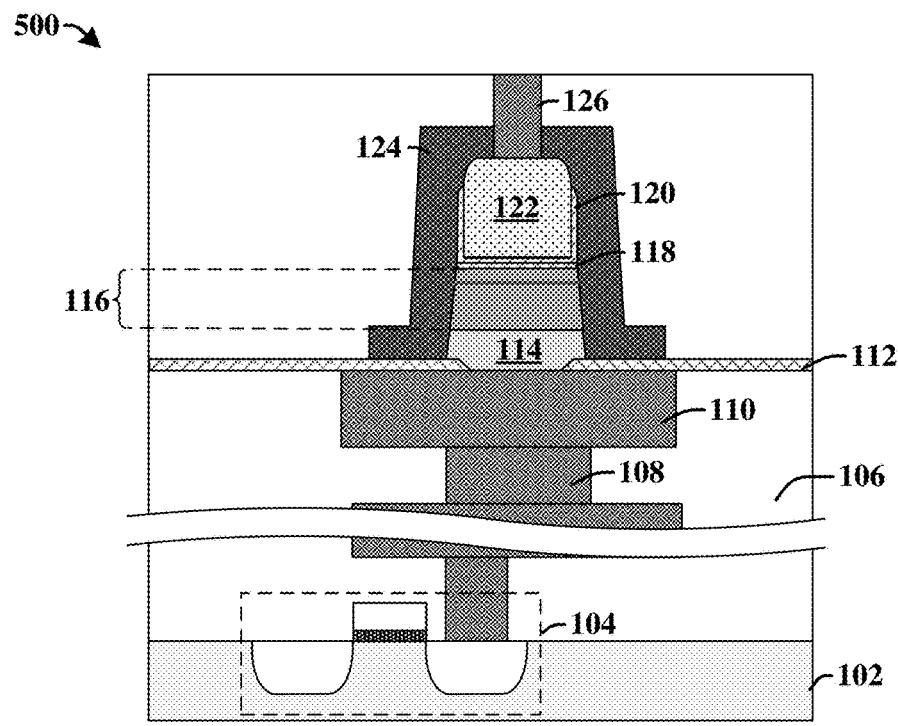
FIG. 5 illustrates some additional embodiments of an integrated chip having an MRAM device comprising a MTJ stack between top and bottom electrodes surrounded by sidewall spacers.

FIG. 5 illustrates an additional embodiment of a cross-sectional view of an integrated chip 500 comprising an MRAM cell.

FIG. 5 comprises an integrated chip 500 with similar features as the integrated chip 300 illustrated in FIG. 3A. In some embodiments, the bottom electrode 114 has outer sidewalls that are aligned with outer sidewalls of the MTJ stack 116. Additionally, in other embodiments, the sidewall spacers 124 cover the outer sidewalls of the bottom electrode 114, as illustrated in FIG. 5. In some embodiments, the sidewall spacers 124 has substantially planar sidewalls, as illustrated in FIG. 5. In other embodiments, the sidewall spacers 124 has outer sidewalls that are continuous and curved, similar to the sidewall spacers 124 in FIG. 4A.

Figure 6:
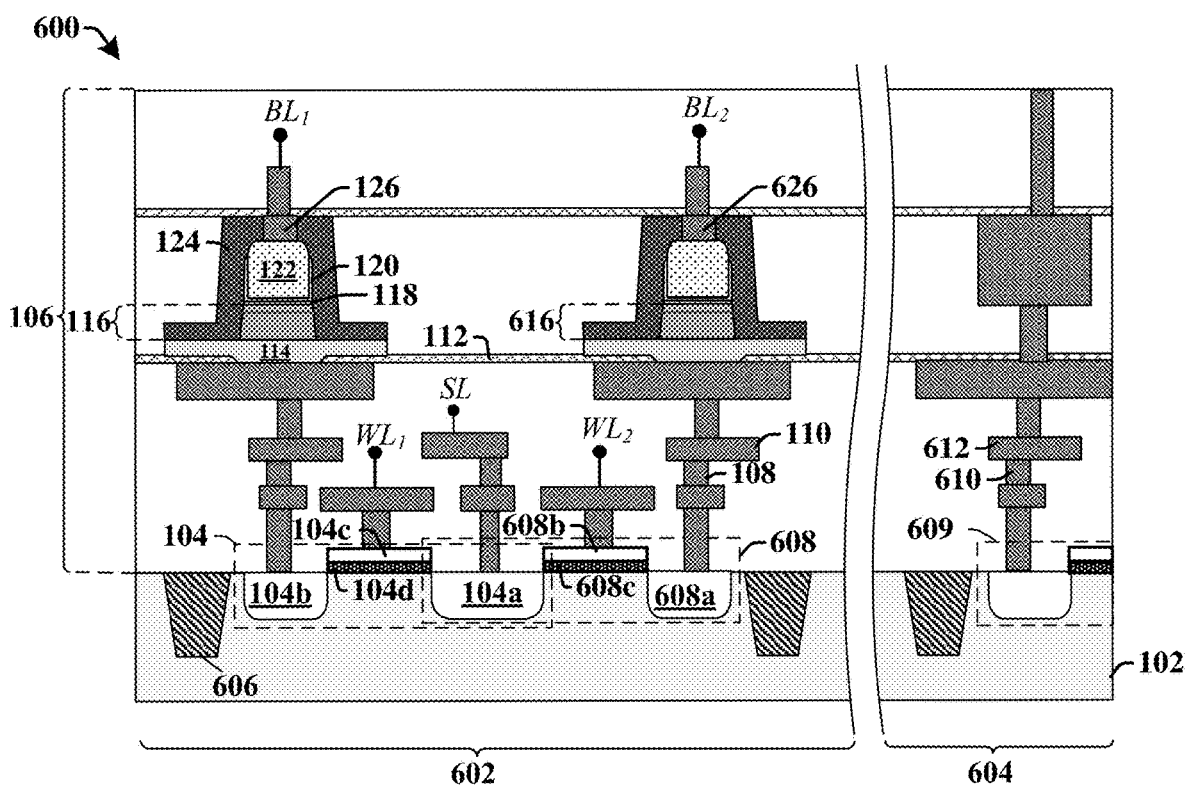
FIG. 6 illustrates a cross-sectional view of an integrated chip having an embedded MRAM device comprising MTJ stacks.

FIG. 6 illustrates a cross-sectional view of some additional embodiments of an integrated chip 600 having an MRAM device.

The integrated chip 600 comprises a substrate 102 including an embedded memory region 602 and a logic region 604. Isolation structures 606 separate the embedded memory region 602 from the logic region 604. The isolation structures 606 comprise a dielectric material and may be, for example, shallow isolation trenches (STI). A dielectric structure 106 is arranged over the substrate 102 and includes interconnect vias 108, interconnect wires 110. The logic region 604 comprises a transistor device 609 arranged within the substrate 102 and coupled to interconnect vias 610 and interconnect wires 612.

The embedded memory region 602 comprises a first access transistor 104 and a second access transistor 608 arranged within a substrate 102. In some embodiments, the first access transistor 104 has a first gate electrode 104c over a first gate oxide layer 104d and arranged between a first drain region 104b and a common source region 104a. Similarly, the second access transistor 608 has a second gate electrode 608b over a second gate oxide layer 608c and arranged between a second drain region 608a and a common source region 104a. The common source region 104a is coupled to a source-line SL and the first gate electrode 104c and the second gate electrode 608b are coupled to word-lines $WL_1$-$WL_2$.

The interconnect vias 108 and interconnect wires 110 couple the first drain region 104b to MTJ stack 116. Similarly, the second drain region 608a is coupled to a second MTJ stack 616. The MTJ stack 116 and the second MTJ stack 616 are coupled to bit-lines $BL_1$-$BL_2$ by upper interconnect structures 126, 626.

Although integrated chip 600 illustrates the word-lines $WL_1$-$WL_2$, the source-line SL, the bit-lines $BL_1$-$BL_2$, and the MTJ stacks 116, 616 as being located at certain levels within a BEOL (back-end-of-the-line) stack, it will be appreciated that the position of these elements is not limited to those illustrated positions. Rather, the elements may be at different locations within a BEOL stack. For example, in some alternative embodiments, the MTJ stack 116 and the second MTJ stack 616 may be located between a second and third metal interconnect wire.

FIGS. 7-19 illustrate cross-sectional views 700-1900 of some embodiments of a method of forming an integrated chip having an embedded MRAM cell. Although FIGS. 7-19 are described in relation to a method, it will be appreciated that the structures disclosed in FIGS. 7-19 are not limited to such a method, but instead may stand alone as structures independent of the method.

Figure 7:
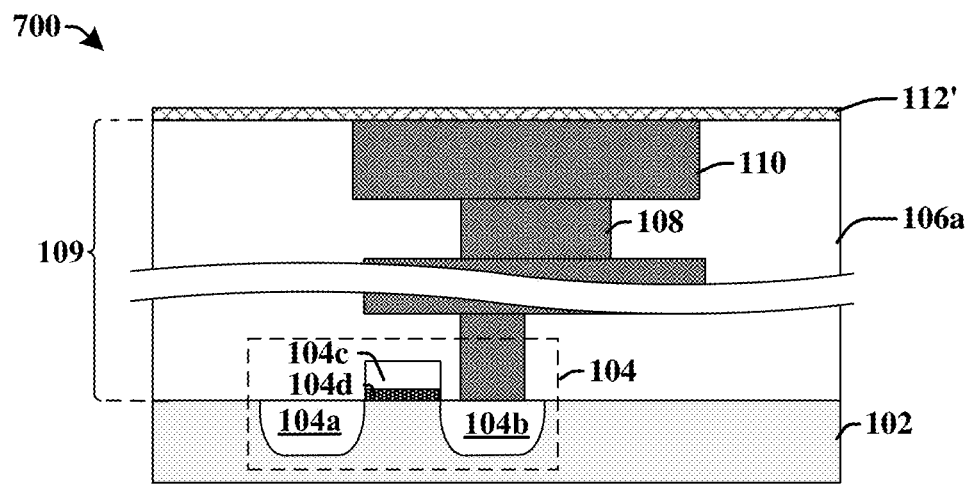
FIGS. 7-19 illustrate cross-sectional views of some embodiments of a method of forming an integrated chip having an MRAM device comprising an MTJ stack between top and bottom electrodes.

As shown in cross-sectional view 700 of FIG. 7, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

A first access transistor 104 is formed over the substrate 102. In some embodiments, the first access transistor 104 may be formed by forming a first gate oxide layer 104d over the substrate 102 and forming a layer of the first gate electrode 104c over the gate oxide. The first gate oxide layer 104d and the layer of first gate electrode 104c may be formed by way of vapor deposition processes (e.g., CVD, PE-CVD, PVD, or ALD). In some embodiments, the first gate electrode 104c may comprise doped polysilicon. In some embodiments, the first gate electrode 104c may comprise a sacrificial gate material that is subsequently replaced with a metal gate material, such as aluminum, cobalt, ruthenium, or the like.

The first gate oxide layer 104d and the first gate electrode 104c are patterned to define a gate structure having a first gate oxide layer 104d and a first gate electrode 104c over the first gate oxide layer 104d. In some embodiments, the first gate oxide layer 104d and the layer of the first gate electrode 104c may be selectively patterned according to a masking layer (not shown) formed over the gate material. In some embodiments, the masking layer may comprise a photosensitive material (e.g., photoresist) formed by a spin coating process. In such embodiments, the layer of photosensitive material is selectively exposed to electromagnetic radiation according to a photomask. The electromagnetic radiation modifies a solubility of exposed regions within the photosensitive material to define soluble regions. The photosensitive material is subsequently developed to define openings within the photosensitive material by removing the soluble regions. In other embodiments, the masking layer may comprise a mask layer (e.g., a silicon nitride layer, a silicon carbide layer, or the like). A first source region (e.g., common source region 104a) and a first drain region 104b are then formed by, in many embodiments, ion implantation using the first gate electrode 104c as a mask.

One or more lower interconnect layers 109 are formed within a lower dielectric structure 106a arranged over the substrate 102 and are coupled to the first access transistor 104. In some embodiments, one or more of the one or more lower interconnect layers 109 may be formed using a damascene process (e.g., a single damascene process or a dual damascene process). The damascene process is performed by forming an ILD layer over the substrate 102, etching the ILD layer to form a via hole and/or a metal trench, and filling the via hole and/or metal trench with a conductive material. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electro-less plating, etc.). In various embodiments, the one or more lower interconnect layers 109 may comprise tungsten, copper, or aluminum copper, or the like.

An etch stop layer 112' is formed over interconnect wire 110 and the lower dielectric structure 106a. In some embodiments, the etch stop layer 112' may be deposited by a physical vapor deposition technique (e.g., PVD, CVD, PE-CVD, ALD, etc.) In some embodiments, the etch stop layer 112' may comprise a nitride (e.g., silicon nitride), a carbide (e.g., silicon carbide), or the like.

Figure 8:
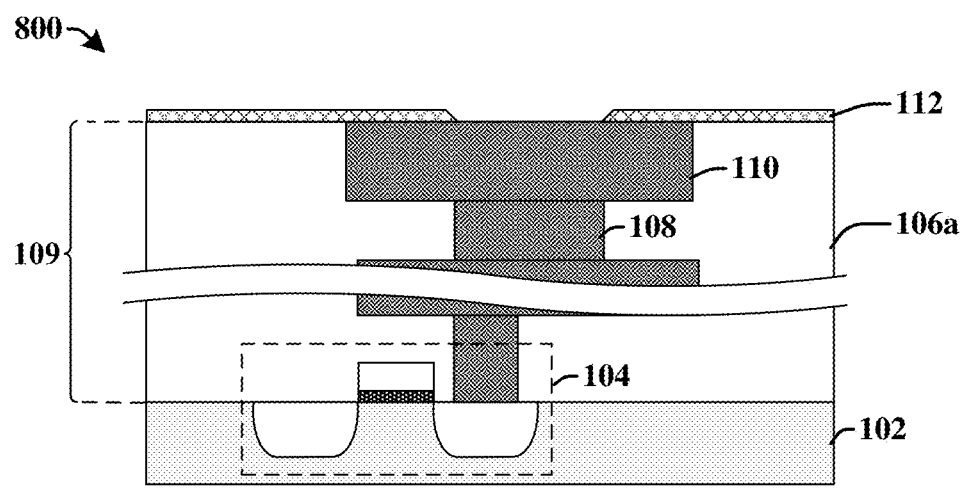

As shown in cross-sectional view 800 of FIG. 8, the etch stop layer 112' is patterned to expose a portion of interconnect wire 110, forming an etch stop structure 112. In many embodiments, the etch stop layer 112' is patterned through photolithography using a mask over the etch stop layer 112'.

Figure 9:
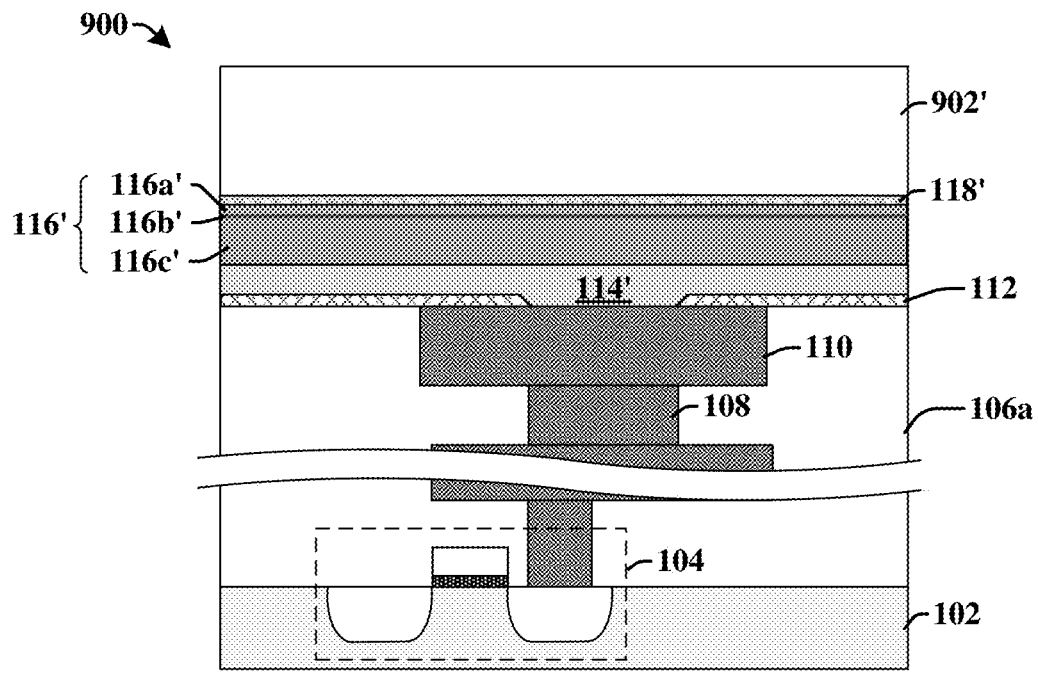

As shown in cross-sectional view 900 of FIG. 9, a bottom electrode layer 114' is deposited over the etch stop structure 112 and interconnect wire 110. The bottom electrode layer 114' is a conductive material, for example, Ta, Ti, W or Ru. In some embodiments, a planarization process (e.g., a chemical mechanical planarization process) may be conducted to remove excess metal such that an upper surface of the bottom electrode layer 114' is substantially planar. A lower ferromagnetic electrode layer 116c' is deposited over the bottom electrode layer 114'. A thin tunneling barrier layer 116b' is deposited over the lower ferromagnetic electrode layer 116c', and an upper ferromagnetic electrode layer 116a' is deposited over the thin tunneling barrier layer 116b'. The upper ferromagnetic electrode layer 116a', the thin tunneling barrier layer 116b', and the lower ferromagnetic electrode layer 116c' make up MTJ stack layers 116'. In some embodiments, a capping film 118' is deposited on top of MTJ stack layers 116'. The capping film 118' may comprise, for example, tantalum, titanium, tantalum nitride, titanium nitride, or combinations thereof. In some embodiments, the capping film 118' may be formed by a deposition technique (e.g., physical vapor deposition (PVD), chemical vapor deposition (CVD), PE-CVD, atomic layer deposition (ALD), sputtering, etc.) to a thickness in a range of between approximately 0.5 nanometer and approximately 5 nanometers. A sacrificial dielectric layer 902' (e.g., an oxide, a low-k dielectric, or an ultra low-k dielectric) is deposited over the MTJ stack layers 116' and/or the capping film 118'.

Figure 10:
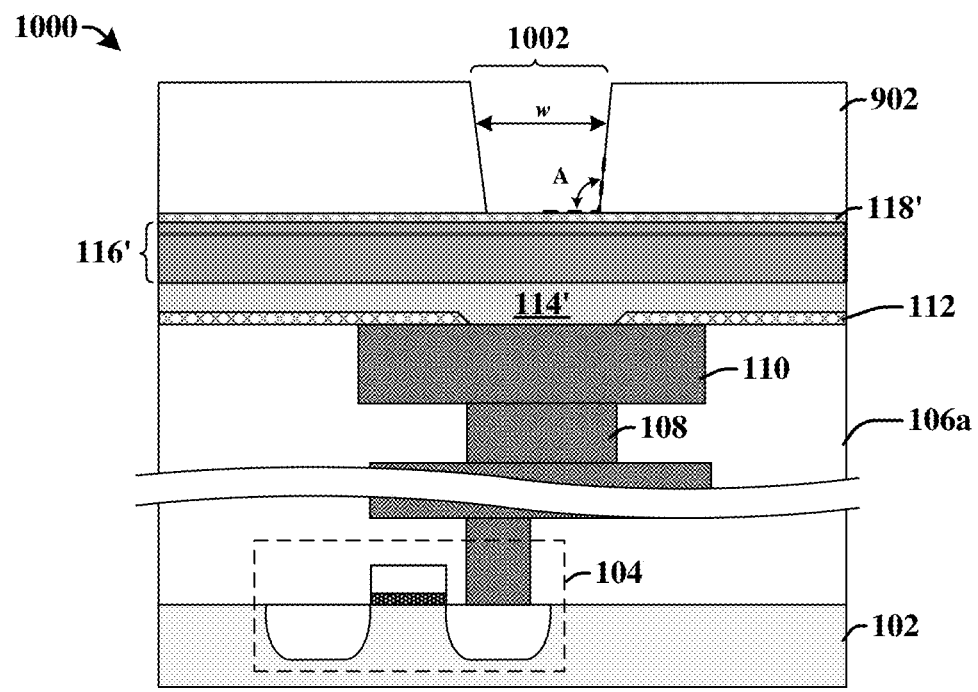

As shown in cross-sectional view 1000 of FIG. 10, the sacrificial dielectric layer 902' is selectively patterned to define a patterned sacrificial dielectric 902 having sidewalls defining an opening 1002 that extends through the patterned sacrificial dielectric 902. The opening 1002 exposes the capping film 118'. In many embodiments, the sacrificial dielectric 902' is patterned by photolithography to form the opening 1002. In some embodiments, a width w of the opening 1002 in the patterned sacrificial dielectric 902 is in the range of between approximately 15 nanometers and approximately 150 nanometers. In many embodiments, the opening 1002 has sidewalls arranged at an obtuse angle A, with respect to an exposed upper surface of the capping film 118'.

Figure 11A:
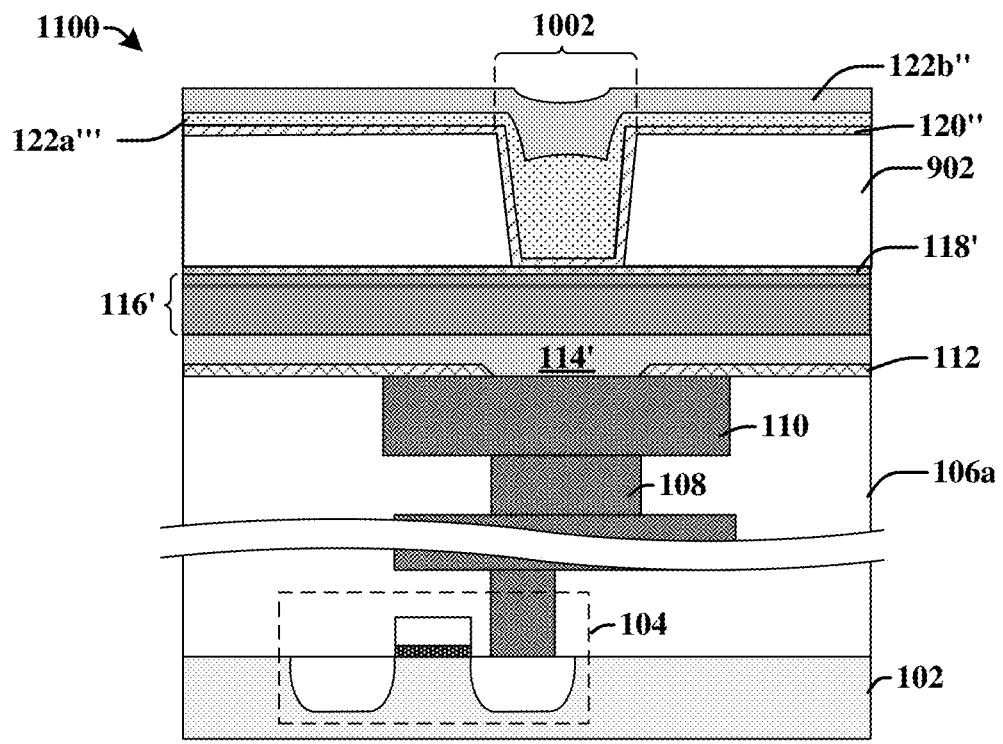

As shown in the cross-sectional view 1100 of FIG. 11A, in some embodiments, a glue material 120" (e.g., a diffusion barrier material) is deposited over the patterned sacrificial dielectric 902 and within the opening 1002 of the patterned sacrificial dielectric 902. In some embodiments, the glue material 120" may be formed by a deposition technique (e.g., physical vapor deposition (PVD), chemical vapor deposition (CVD), PE-CVD, atomic layer deposition (ALD), sputtering, etc.) to a thickness in a range of between approximately 1 nanometer and approximately 15 nanometers and may comprise tantalum, titanium, tantalum nitride, titanium nitride, or combinations thereof.

In some embodiments, illustrated in FIG. 11A, a plurality of top electrode materials are deposited over the glue material 120". For example, a first top electrode material 122a" may be deposited within the opening 1002, and a second top electrode material 122b" may be deposited within the opening 1002 over the first top electrode material 122a". The first top electrode material 122a" is a different material than the second top electrode material 122b". The first top electrode material 122a" and the second top electrode material 122b" are conductive materials, such as, for example, tantalum, titanium, tantalum nitride, titanium nitride, tungsten, or ruthenium. In some embodiments, the second top electrode material 122b" is used as a mask for patterning in future steps. Thus, in some embodiments, the first top electrode material 122a" has a higher etch rate than the second top electrode material 122b".

Figure 11B:
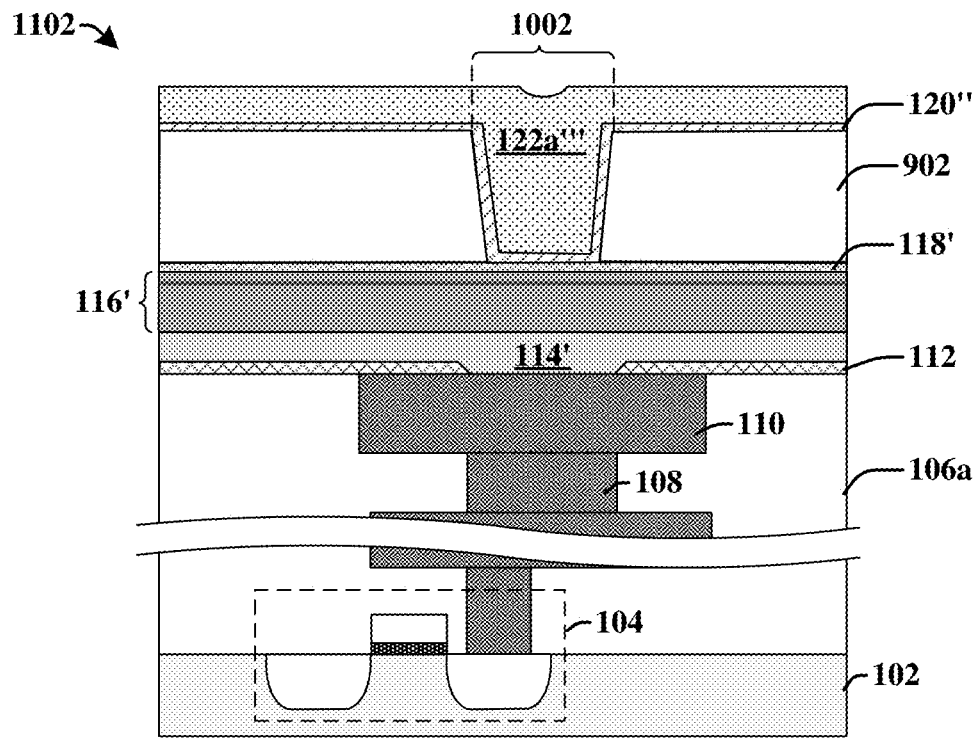

In some alternative embodiments, shown in the cross-sectional view 1102 of FIG. 11B, a first top electrode material 122a" is deposited over the patterned sacrificial dielectric 902 and within the opening 1002 to completely fill the opening 1002. The second top electrode material 122b" is not necessary in some embodiments that have different future patterning steps than embodiments as in FIG. 11A.

Figure 12:
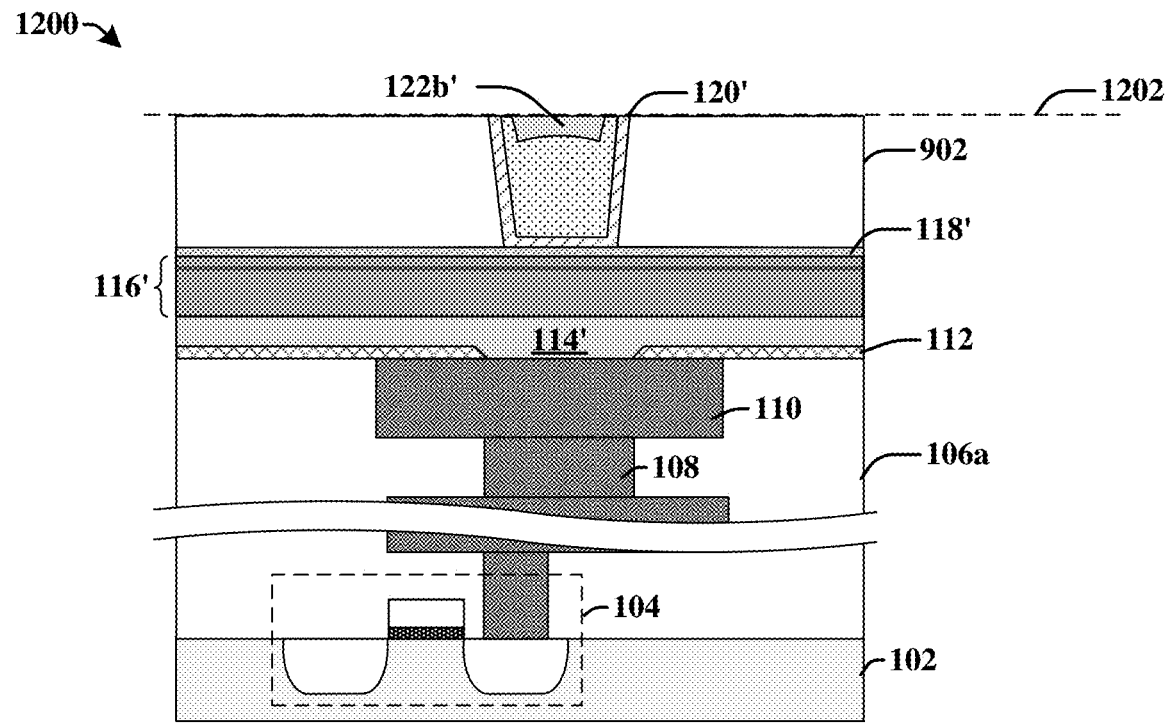

As shown in the cross-sectional view 1200 of FIG. 12, a planarization process is performed along line 1202. The planarization process removes excess of the glue material 120", the first top electrode material 122a", and the second top electrode material 122b' that are above a topmost surface of the patterned sacrificial dielectric 902 to form a planar glue layer 120' (e.g., a planar diffusion barrier layer), a planar first top electrode 122a', and a planar second top electrode 122b. In some embodiments, the planarization process may comprise a chemical mechanical planarization (CMP) process, wherein the CMP process is conducted until a top surface of the patterned sacrificial dielectric 902 is exposed.

Figure 13:
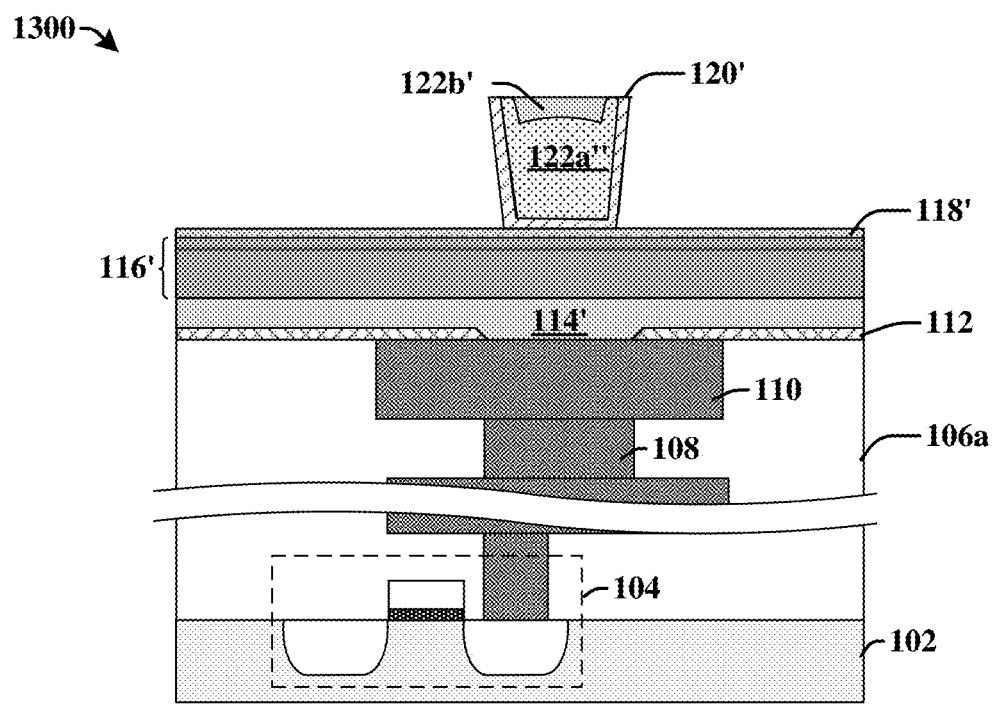

As shown in the cross-sectional view 1300 of FIG. 13, the patterned sacrificial dielectric 902 is removed such that the planar glue layer 120', planar first top electrode 122a', and planar second top electrode 122b are arranged overlying the MTJ stack layers 116'. The patterned sacrificial dielectric 902 may be removed using an etchant.

Figure 14:
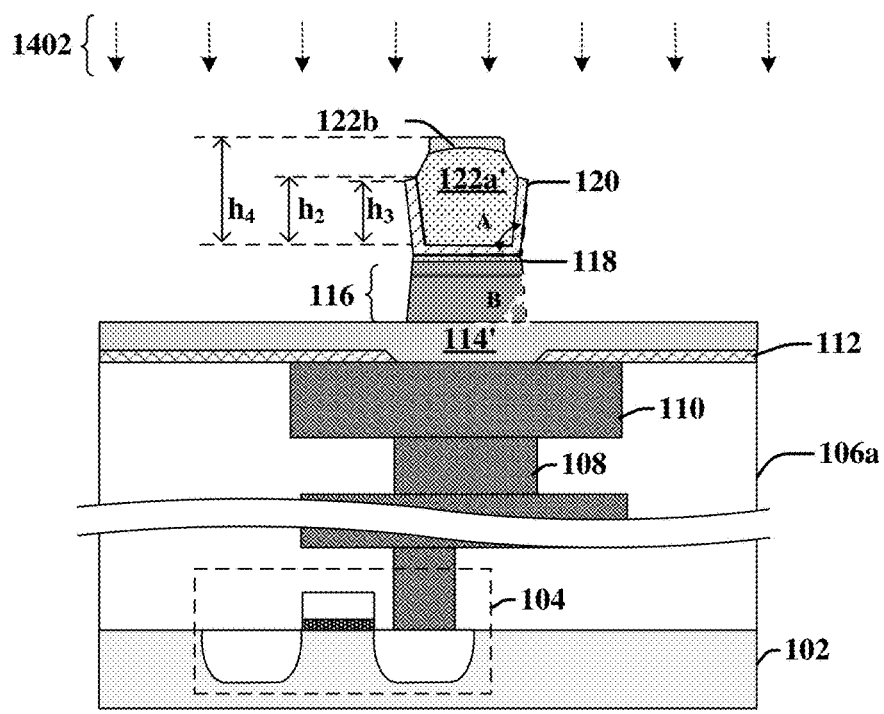

As shown in the cross-sectional view 1400 of FIG. 14, a first etching process may use one or more etchants 1402 to pattern the MTJ stack layers 116' and the capping film 118' to form a capping layer 118 over the MTJ stack 116. The one or more etchants 1402 may comprise a dry etchant or a wet etchant. The planar second top electrode 122b is used in this embodiment to act as a hard mask for the one or more etchants 1402. A top portion of the planar second top electrode 122b may be removed by the one or more etchants 1402, such that after the first etching process, the planar second top electrode 122b is thinner than before the first etching process.

The MTJ stack 116 has sidewalls that meet a bottom surface at angle B as illustrated in FIG. 14, such that angle B is equal to or less than angle A. During the first etching process, portions of the planar first top electrode 122a' uncovered by the planar second top electrode 122b may be removed, but a substantial portion of the planar first top electrode 122a' remains. Upper portions of the planar glue layer 120' also may be removed during the first etching process. The glue layer 120 and the planar top electrode 122a' may have slanted upper sidewalls as a result of the first etching process, such that the glue layer 120 has a second maximum height $h_2$ measured from a bottom surface of the planar first top electrode 122a' to an inner sidewall of the glue layer 120 and a third maximum height $h_3$ measured from the bottom surface of the planar first top electrode 122a' to an outer sidewall of the glue layer 120. The third maximum height $h_3$ measures to be less than the second maximum height $h_2$ by a range of between approximately 1 nanometer and approximately 5 nanometers due to effects from the one or more etchants 1402. A fourth maximum height $h_4$ is measured after the first etching process from a bottom of the planar first top electrode 122a' to a top of the planar second top electrode 122b, as shown in FIG. 14. In some embodiments (not shown), an additional etching processes may be used after the first etching process to pattern the bottom electrode layer 114', again using the planar second top electrode 122b as the hard mask for the additional etch.

Figure 15:
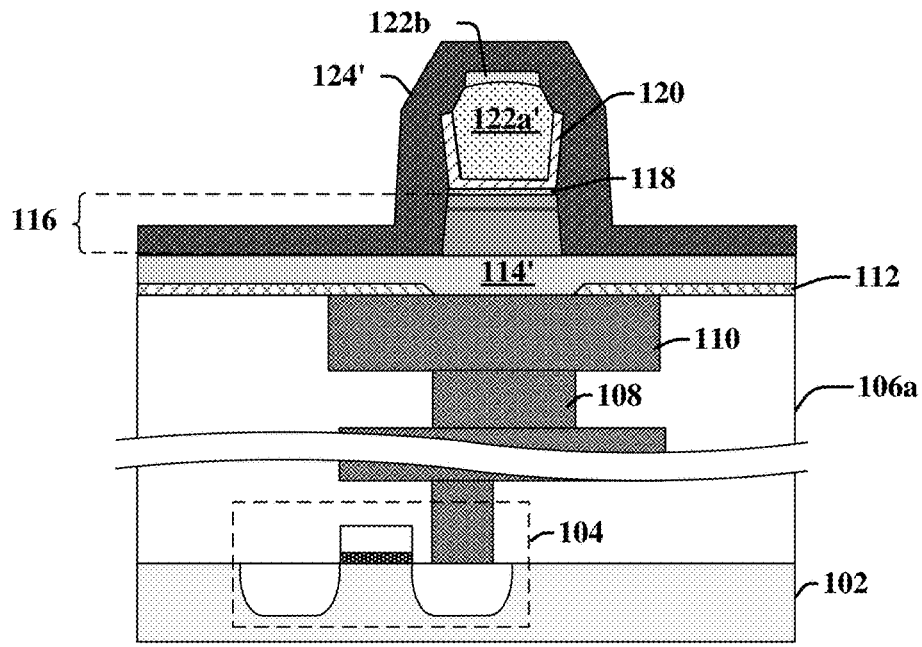

As shown in the cross-sectional view 1500 of FIG. 15, a sidewall spacer layer 124' is conformably deposited over the embodiment in cross-sectional view 1400. In some embodiments, the sidewall spacer layer 124' may be deposited by a deposition technique (e.g., PVD, CVD, PE-CVD, ALD, sputtering, etc.). The sidewall spacer layer 124' may comprise a dielectric material such as a nitride (e.g., silicon nitride), an oxide (e.g., silicon oxide), a carbide (e.g., silicon carbide), or the like.

Figure 16:
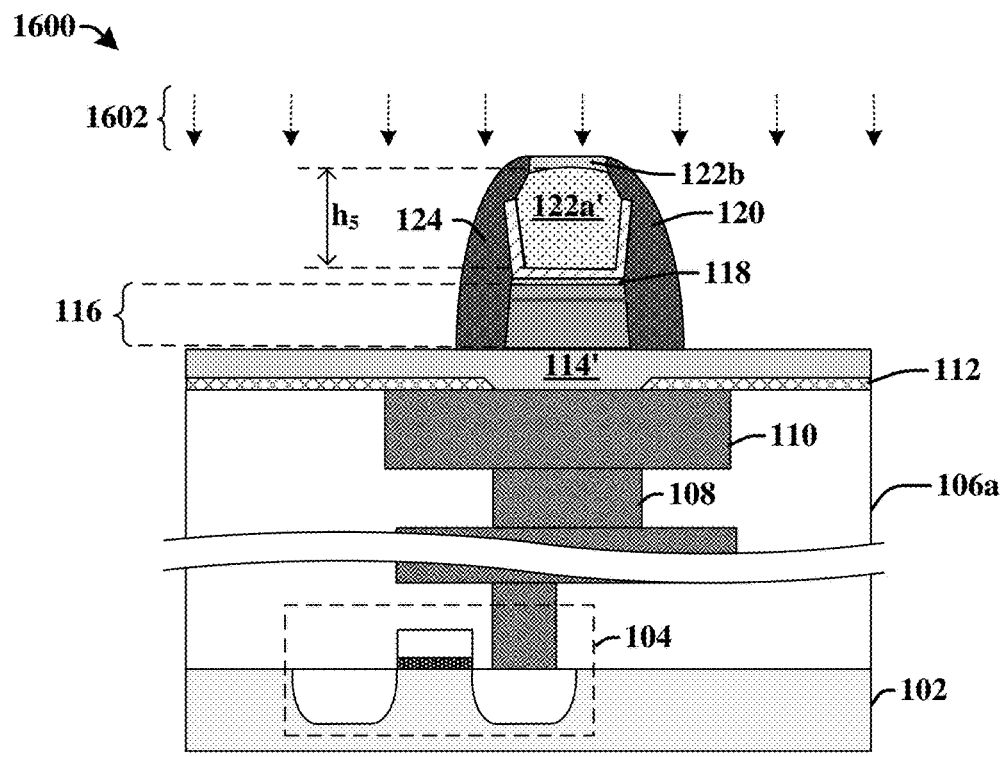

As shown in the cross-sectional view 1600 of FIG. 16, a second etching process may use one or more etchants 1602 (e.g., a dry etchant) to etch the sidewall spacer layer 124' to form sidewall spacers 124. The sidewall spacers 124 typically have a curved outer sidewall because of vertical etching effects. The second etching process removes portions of the sidewall spacer layer 124' over the bottom electrode layer 114' and over the planar second top electrode 122b. After the second etching process, the planar first top electrode 122a' has a fifth maximum height $h_5$ measured from a bottom surface of the planar first top electrode 122a' to a top surface of the planar first top electrode 122a'.

Figure 17:
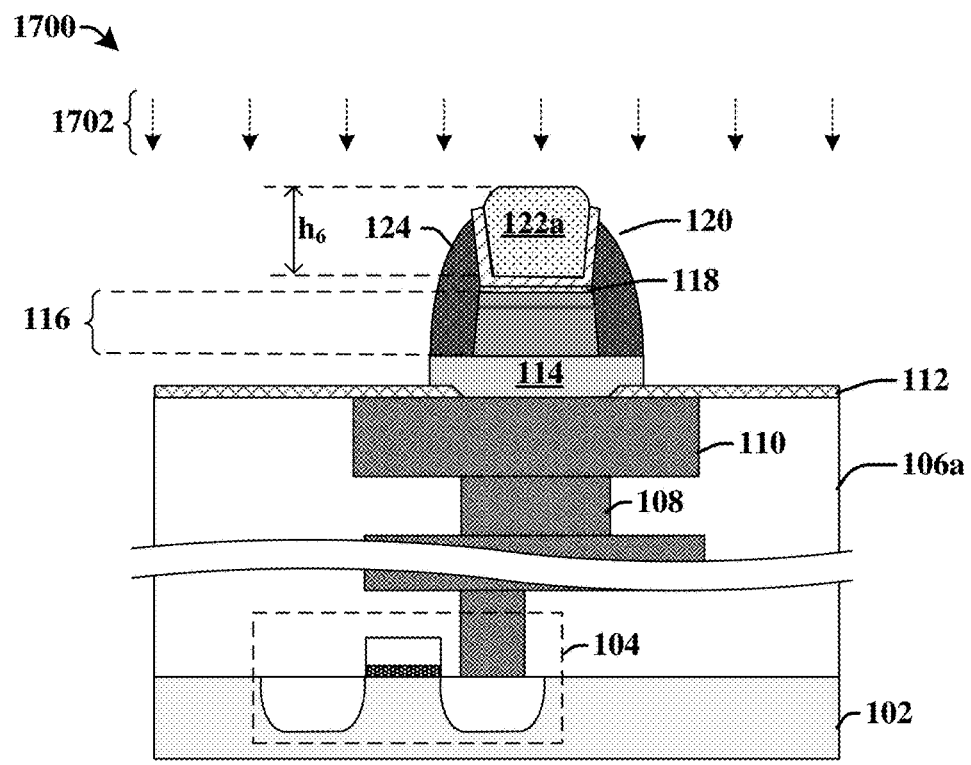

As shown in the cross-sectional view 1700 of FIG. 17, a third etching process may use one or more etchants 1702 (e.g., a dry etchant) to pattern the bottom electrode layer 114' to form the bottom electrode 114. The planar second top electrode 122b may act as a hard mask, as well as the sidewall spacers 124. The sidewall spacers 124 may reduce in height due to etching effects from the third etching process. For example, in the cross-sectional view 1700, the sidewall spacers 124 have a top surface that is below a top surface of the glue layer 120 after the third etching process is used. During the third etching process, in some embodiments, the planar second top electrode 122b is removed, and part of the planar first top electrode 122a' is removed resulting in a first top electrode 122a. A sixth maximum height $h_6$ is measured from a bottom surface of the first top electrode 122a to a top surface of the first top electrode 122a after the third etching process. The sixth maximum height $h_6$ in cross-sectional view 1700 is less than the fifth maximum height $h_5$ in cross-sectional view 1600 due to effects of the third etching process.

The sixth maximum height $h_6$ may measure to be in the range of between approximately 10 nanometers to approximately 100 nanometers.

Although the bottom electrode 114 is patterned in the method illustrated by cross-sectional view 1700 in FIG. 17, it will be appreciated that the bottom electrode 114 may be patterned during other steps in the method, such as with an additional etch after patterning of the MTJ stack 116 or even prior to the deposition of the MTJ stack layers 116' by using an etch process.

Figure 18:
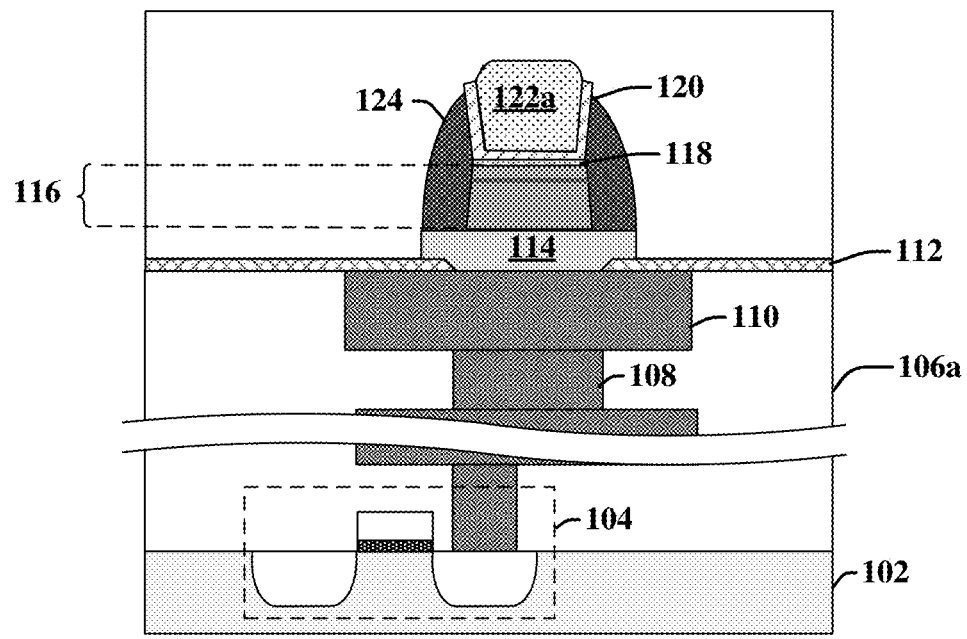

As shown in cross-sectional view 1800 of FIG. 18, an upper dielectric structure 106b is deposited over the etch stop structure 112. The upper dielectric structure 106b covers top surfaces of the first top electrode 122a.

Figure 19:
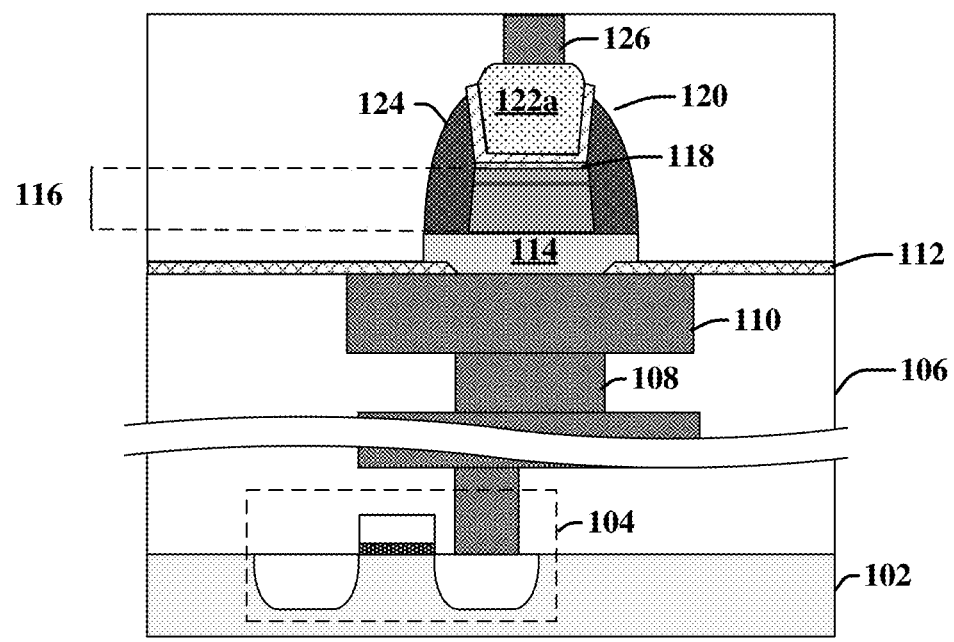

As shown in cross-sectional view 1900 of FIG. 19, the upper dielectric structure 106b is patterned to define an opening over the first top electrode 122a. An upper interconnect structure 126 is subsequently formed within the opening and over the first top electrode 122a. The first top electrode 122a is electrically coupled to the upper interconnect structure 126.

Figure 20:
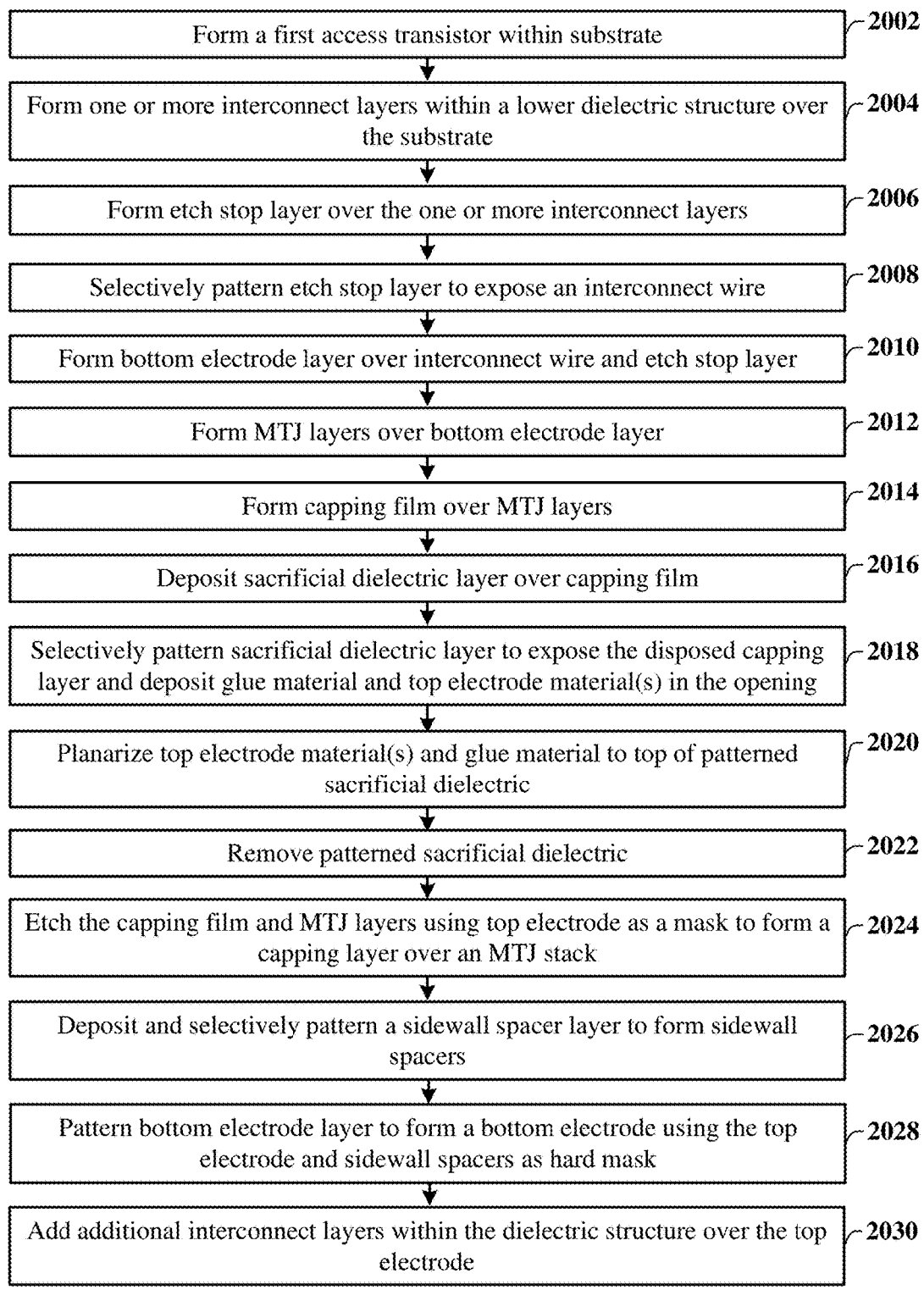
FIG. 20 illustrates a flow diagram of some embodiments of a method of forming an integrated chip having an MRAM device comprising an MTJ stack between top and bottom electrodes.

FIG. 20 illustrates a flow diagram of some embodiments of a method 2000 of forming an integrated chip having an MRAM device.

While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, a first access transistor is formed within a substrate. FIG. 7 illustrates a cross-sectional view 700 of some embodiments corresponding to act 2002.

At 2004, one or more interconnect layers are formed within a lower dielectric structure formed over the substrate. FIG. 7 illustrates a cross-sectional view 700 of some embodiments corresponding to act 2004.

At 2006, an etch stop layer is formed over the one or more interconnect layers. FIG. 7 illustrates a cross-sectional view 700 of some embodiments corresponding to act 2006.

At 2008, the etch stop layer is selectively patterned to expose an interconnect wire. FIG. 8 illustrates a cross-sectional view 800 of some embodiments corresponding to act 2008.

At 2010, a bottom electrode layer is formed over the interconnect wire and etch stop layer.

At 2012, MTJ layers are formed over the bottom electrode layer.

At 2014, a capping film is formed over the MTJ layers.

At 2016, a sacrificial dielectric layer is deposited over the capping film. FIG. 9 illustrates a cross-sectional view 900 of some embodiments corresponding to acts 2010-2016.

At 2018, the sacrificial dielectric layer is patterned to form an opening that exposes the capping film. A glue material and one or more top electrode materials are deposited within the opening. FIGS. 10, 11A and 11B illustrate cross-sectional views 1000, 1100 and 1102 of some embodiments corresponding to act 2018.

At 2020, the one or more top electrode materials and glue layer are planarized to the top of the patterned sacrificial dielectric layer. FIG. 12 illustrates a cross-sectional view 1200 of some embodiments corresponding to act 2020.

At 2022, the patterned sacrificial dielectric is removed. FIG. 13 illustrates a cross-sectional view 1300 of some embodiments corresponding to act 2022.

At 2024, the capping film and MTJ layers are etched using the top electrode as the hard mask to form a capping layer over an MTJ stack. FIG. 14 illustrates a cross-sectional view 1400 of some embodiments corresponding to act 2024.

At 2026, a sidewall spacer layer is deposited and etched to form sidewall spacers. FIGS. 15 and 16 illustrate cross-sectional views 1500 and 1600 of some embodiments corresponding to act 2026.

At 2028, the bottom electrode layer is patterned to from a bottom electrode, using the top electrode and the sidewall spacers as a mask. FIG. 17 illustrates a cross-sectional view 1700 of some embodiments corresponding to act 2028.

At 2030, additional interconnect layers are formed within an upper dielectric structure over the top electrode. FIGS. 18 and 19 illustrate cross-sectional views 1800 and 1900 of some embodiments corresponding to act 2030.

Therefore, the present disclosure relates to a new method of manufacturing MTJ stacks that eliminates a top electrode etch to provide for improved control over critical dimensions of the top electrode structure and an underlying MTJ stack.

Accordingly, in some embodiments, the present disclosure relates to a method of forming an integrated chip. The method includes forming magnetic tunnel junction (MTJ) layers over a bottom electrode layer; forming a sacrificial dielectric layer over the MTJ layers; patterning the sacrificial dielectric layer to define a cavity; forming a top electrode material within the cavity; removing the sacrificial dielectric layer; and patterning the MTJ layers according to the top electrode material to define an MTJ stack after removing the sacrificial dielectric layer. In some embodiments, the method further includes depositing a glue layer onto surfaces of the sacrificial layer defining the cavity; and depositing the top electrode material onto the glue layer to fill the cavity. In some embodiments, after patterning the MTJ layers according to the top electrode material, the glue layer has a first height measured from a bottom surface of the top electrode material to a top surface of the glue layer and the top electrode material has a second height measured from a bottom surface of the top electrode material to a top surface of the top electrode material, the second height greater than the first height. In some embodiments, an etching process used to pattern the MTJ layers according to the top electrode material removes a part of the glue layer and causes an outermost sidewall of the glue layer facing away from the top electrode material to be curved. In some embodiments, a height of the top electrode material decreases during the patterning of the MTJ layers. In some embodiments, the method further includes forming a capping film over the MTJ layers and below the sacrificial dielectric layer, so that patterning the sacrificial dielectric layer exposes a top surface of the capping film. In some embodiments, the method further includes patterning the capping film to define a capping layer over the MTJ layers, the capping layer having a thickness that increases from a center of the capping layer to an outermost sidewall of the capping layer.

In other embodiments, the present disclosure relates to a method of forming an integrated chip. The method includes forming magnetic tunnel junction (MTJ) layers over a bottom electrode layer; depositing a sacrificial layer over the MTJ layers; etching the sacrificial layer to form a cavity defined by sidewalls of the sacrificial layer; depositing a glue layer onto and between the sidewalls of the sacrificial layer defining the cavity; forming a conductive material over the glue layer and within the cavity, wherein the glue layer contacts sidewalls and a bottom surface of the conductive material; removing the sacrificial layer; and patterning the MTJ layers according to the conductive material and the glue layer to define a magnetic tunnel junction (MTJ). In some embodiments, the method further includes forming a capping film over the MTJ layers prior to depositing the sacrificial layer; and patterning the capping film to define a capping layer. In some embodiments, after removing the sacrificial layer, the glue layer has a first height measured from the bottom surface of the conductive material to a top surface of the glue layer that is substantially equal to a second height of the conductive material. In some embodiments, after patterning the MTJ layers, the glue layer has a third height measured from the bottom surface of the conductive material to the top surface of the glue layer that is less than the second height. In some embodiments, the conductive material has sidewalls arranged at a first angle with respect to the bottom surface of the conductive material and the MTJ has sidewalls arranged at a second angle with respect to a bottom surface of the MTJ, the second angle less than the first angle. In some embodiments, the method further includes depositing a sidewall spacer layer over the conductive material; patterning the sidewall spacer layer to form a sidewall spacer surrounding the MT, wherein patterning the sidewall spacer layer exposes a top surface of the conductive material and top surfaces of the bottom electrode layer; and etching the bottom electrode layer using the conductive material and the sidewall spacer as a mask. In some embodiments, after forming the conductive material within the cavity, a top surface of the conductive material meets a sidewall of the conductive material at an angled corner; and after patterning of the MTJ layers according to the conductive material, the top surface of the conductive material meets the sidewall of the conductive material at a rounded corner.

In yet other embodiments, the present disclosure relates to an integrated chip. The integrated chip includes one or more lower interconnect layers arranged within one or more stacked inter-level dielectric (ILD) layers over a substrate; an etch stop structure disposed over the one or more lower interconnect layers; a bottom electrode disposed over the etch stop structure, the bottom electrode electrically contacts the one or more lower interconnect layers; a magnetic tunnel junction (MTJ) stack disposed over the bottom electrode, the MTJ stack has sidewalls arranged at a first angle with respect to a bottom surface of the MTJ stack; and a top electrode disposed over the MTJ stack, the top electrode has sidewalls arranged at a second angle with respect to a bottom surface of the top electrode, the second angle greater than the first angle. In some embodiments, the integrated chip further includes a capping layer above the MTJ stack and below the top electrode. In some embodiments, the capping layer has a curved upper surface and a thickness that increases from a center of the capping layer to an outermost sidewall of the capping layer. In some embodiments, the integrated chip further includes a diffusion barrier layer continuously extending from between the top electrode and the MTJ stack to contact sidewalls of the top electrode. In some embodiments, the diffusion barrier layer has a curved upper surface that increases in height as a distance from the sidewalls of the top electrode decreases. In some embodiments, a first height is measured from the bottom surface of the top electrode to a topmost surface of the top electrode, a second height is measured from the bottom surface of the top electrode to a topmost surface of the diffusion barrier layer, and the first height is greater than the second height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a magnetic tunnel junction (MTJ) stack over a bottom electrode layer;
   forming a sacrificial dielectric over the MTJ stack;
   patterning the sacrificial dielectric to form a cavity;
   forming a top electrode material within the cavity;
   forming a mask over the top electrode material, the top electrode material comprises a conductive material extending from directly below the mask to a non-zero distance laterally past an outermost sidewall of the mask;
   removing the sacrificial dielectric;
   patterning the MTJ stack according to the top electrode material and the mask to form an MTJ after removing the sacrificial dielectric; and
   wherein an etchant that is used to pattern the MTJ stack etches the top electrode material with the mask in place.

2. The method of claim 1, further comprising:
   forming a masking layer that extends from within the cavity to directly over a topmost surface of the sacrificial dielectric; and
   performing a planarization process to form the mask, wherein the planarization process removes a part of the masking layer that is directly over the topmost surface of the sacrificial dielectric and exposes an upper surface of the top electrode material.

3. The method of claim 1, wherein the top electrode material has a larger width than the mask.

4. The method of claim 1, further comprising:
   forming a glue layer within the cavity prior to forming the top electrode material, wherein a part of the top electrode material is laterally between a sidewall of the glue layer and the outermost sidewall of the mask.

5. The method of claim 4, further comprising:
   forming a sidewall spacer along opposing sidewalls of the glue layer, the top electrode material, and the mask; and
   performing an etching process to remove a part of the sidewall spacer and to recess the sidewall spacer below a top of the glue layer.

6. The method of claim 5, wherein the etching process completely removes the mask.

7. A method of forming an integrated chip, comprising:
   forming magnetic tunnel junction (MTJ) layers over a bottom electrode layer;
   forming a sacrificial dielectric over the MTJ layers;
   patterning the sacrificial dielectric to form a cavity;
   forming a top electrode material within the cavity;
   forming a glue layer within the cavity prior to forming the top electrode material within the cavity;
   removing the sacrificial dielectric; and
   patterning the MTJ layers and the top electrode material to form an MTJ stack and a top electrode after removing the sacrificial dielectric, wherein the top electrode has a maximum width that is a first non-zero distance above a bottom of the top electrode and that is a second non-zero distance below a top of the top electrode, wherein the glue layer completely covers lower angled sidewalls of the top electrode that are tapered to increase a width of the top electrode as a distance over a substrate increases, and wherein upper angled sidewalls of the top electrode, which are not covered by the glue layer, are tapered to decrease the width of the top electrode as the distance over the substrate increases.

8. The method of claim 7, wherein the first non-zero distance is different than the second non-zero distance.

9. The method of claim 7, wherein the upper angled sidewalls and the lower angled sidewalls of the top electrode meet at the maximum width of the top electrode, the maximum width being at a top of the glue layer.

10. The method of claim 7, further comprising:
    a sidewall spacer arranged along an outermost sidewall of the top electrode and the MTJ stack, wherein the top electrode has a rounded surface that continuously extends from a topmost surface of the top electrode to the glue layer.

11. The method of claim 7, wherein the top electrode has a truncated bi-conic cross section.

12. The method of claim 7, wherein the top electrode has a first width along a topmost surface of the top electrode, a second width along a bottommost surface of the top electrode, and a third width vertically between the bottommost surface and the topmost surface of the top electrode, the first width being smaller than the second width and the second width being smaller than the third width.

13. A method of forming an integrated chip, comprising:
    forming a magnetic tunnel junction (MTJ) stack over a bottom electrode layer;
    forming a sacrificial dielectric over the MTJ stack;
    patterning the sacrificial dielectric to form a cavity;
    forming a top electrode material within the cavity;
    forming a masking layer that extends from within the cavity to directly over the sacrificial dielectric;

performing a planarization process on both the masking layer and the top electrode material after forming the masking layer;

removing the sacrificial dielectric; and patterning the MTJ stack according to the top electrode material to form an MTJ and a top electrode after removing the sacrificial dielectric.

14. The method of claim 13, further comprising:

forming a glue layer within the cavity prior to forming the top electrode material, wherein the glue layer continuously extends from directly below the top electrode to a topmost surface of the glue layer that is laterally outside of the top electrode and a non-zero distance below a top of the top electrode.

15. The method of claim 13, further comprising:

forming a sidewall spacer over and along opposing sidewalls of the top electrode;

performing a first etching process to remove a first part of the sidewall spacer and to expose the bottom electrode layer; and performing a second etching process to remove a second part of the sidewall spacer and to recess the sidewall spacer below a topmost surface of the top electrode.

16. The method of claim 13, further comprising:

forming a capping layer onto the MTJ stack prior to forming the top electrode material, wherein the capping layer has a variable thickness below the top electrode material.

17. The method of claim 16, wherein the capping layer has larger thicknesses along opposing outermost sidewalls than between the opposing outermost sidewalls.

18. The method of claim 13, further comprising:

forming the masking layer over and along interior sidewalls of the top electrode material, wherein the masking layer is formed to continuously extend from within the cavity to directly over a top of the sacrificial dielectric;

removing a part of the masking layer that is directly over the top of the sacrificial dielectric with the planarization process; and patterning the MTJ stack with the masking layer in place over the top electrode material.

19. The method of claim 13, wherein the planarization process forms a mask over the top electrode material and exposes a top surface of the top electrode material outside of the mask.

20. The method of claim 13, further comprising:

forming a glue layer within the cavity prior to forming the top electrode material, wherein the glue layer has a thickness that varies below a bottom surface of the top electrode.

* * * * *